(12) United States Patent
Ito (10) Patent No.: US 9,306,057 B2
(45) Date of Patent: Apr. 5, 2016

(54) METAL OXIDE SEMICONDUCTOR DEVICES AND FABRICATION METHODS

(71) Applicant: Broadcom Corporation, Irvine, CA (US)

(72) Inventor: Akira Ito, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 13/728,264

(22) Filed: Dec. 27, 2012

(65) Prior Publication Data

US 2014/0183628 A1   Jul. 3, 2014

(51) Int. Cl.
| | |
|---|---|
| *H01L 29/66* | (2006.01) |
| *H01L 29/78* | (2006.01) |
| *H01L 29/417* | (2006.01) |
| *H01L 29/08* | (2006.01) |
| H01L 29/45 | (2006.01) |
| H01L 29/49 | (2006.01) |

(52) U.S. Cl.
CPC .......... *H01L 29/7816* (2013.01); *H01L 29/086* (2013.01); *H01L 29/0847* (2013.01); *H01L 29/0865* (2013.01); *H01L 29/0869* (2013.01); *H01L 29/0882* (2013.01); *H01L 29/0886* (2013.01); *H01L 29/41775* (2013.01); *H01L 29/66659* (2013.01); *H01L 29/66689* (2013.01); *H01L 29/7835* (2013.01); H01L 29/456 (2013.01); H01L 29/4933 (2013.01); H01L 29/665 (2013.01)

(58) Field of Classification Search
CPC .............. H01L 21/823418; H01L 21/823814; H01L 29/41783; H01L 21/2652; H01L 29/517; H01L 29/6659; H01L 29/66545; H01L 29/7833; H01L 29/7835; H01L 29/78; H01L 29/7801; H01L 27/105; H01L 21/823842; H01L 29/0847; H01L 27/1203; H01L 29/78621; H01L 29/66643
USPC .......... 257/E21.619, E21.634, 369, 104, 173, 257/20, 213, 25, 275, 278, 296, 328, 347, 257/348, 356, 357, 360, 363, 379, 380, 384, 257/385, 400, 401, 402, 410, 434, 511, 565, 257/642, 686, 69, 713, 72, 777, 88, 99; 438/231, 300, 302, 197, 289, 199, 217, 438/305, 306, 585, 591, 232, 301, 107, 142, 438/275, 291, 294, 296, 303, 400, 592, 129, 438/14, 17, 174, 183, 200, 202, 204, 207, 438/218, 230, 233, 238, 240, 253, 256, 257, 438/283, 286, 3, 307, 309, 369, 381, 382, 438/396, 399, 424, 479, 589, 595, 597, 689, 438/692, 700
See application file for complete search history.

(56) References Cited

U.S. PATENT DOCUMENTS

| | | | |
|---|---|---|---|
| 8,048,765 B2 | 11/2011 | Chen et al. | |
| 2002/0074606 A1* | 6/2002 | Mosher | 257/368 |
| 2003/0127694 A1* | 7/2003 | Morton et al. | 257/371 |
| 2006/0131656 A1* | 6/2006 | Shin et al. | 257/369 |
| 2007/0194387 A1* | 8/2007 | Dyer et al. | 257/369 |
| 2010/0200916 A1* | 8/2010 | Gossner et al. | 257/335 |
| 2010/0295126 A1 | 11/2010 | Ito | |
| 2011/0049620 A1* | 3/2011 | Chen et al. | 257/336 |

\* cited by examiner

*Primary Examiner* — Su C Kim
*Assistant Examiner* — Junaiden Mirsalahuddin
(74) *Attorney, Agent, or Firm* — Brinks Gilson & Lione (57) ABSTRACT

A semiconductor device includes a first well and a second well implanted in a semiconductor substrate. The semiconductor device further includes a raised drain structure above and in contact with the second well and separate from the gate structure. The raised drain structure includes a drain connection point above the surface of the second well.

20 Claims, 7 Drawing Sheets

METAL OXIDE SEMICONDUCTOR DEVICES AND FABRICATION METHODS

TECHNICAL FIELD

This disclosure relates generally to a metal oxide semiconductor field effect transistor (MOSFET). More particularly, it relates to fabrication methods and device structures that increase the breakdown voltage of a laterally diffused metal oxide semiconductor (LDMOS).

BACKGROUND

Silicon semiconductor processing has evolved sophisticated operations for fabricating integrated circuits. As advancement in fabrication process technology continues, the core and Input/Output (I/O) operating voltages of integrated circuits have decreased. However, operating voltages of auxiliary devices have remained about the same. The auxiliary devices include devices interfaced to the integrated circuits. For example, the auxiliary devices may be printers, scanners, disk drives, tape drives, microphones, speakers, or cameras.

An integrated circuit may include an interconnected array of active and passive elements, such as transistors, resistors, capacitors, and inductors, integrated with or deposited on a substrate by a series of compatible processes. The auxiliary devices may operate at voltages above a breakdown voltage of the transistors contained within the integrated circuit. As the operating voltages applied to the transistors increase, the transistors will eventually breakdown allowing an uncontrollable increase in current. Examples of the detrimental effects of breakdown may include punch-through, avalanche breakdown, and gate oxide breakdown to provide some examples. Furthermore, operating above the breakdown voltage for a significant duration reduces the lifetime of the transistors.

BRIEF DESCRIPTION OF THE DRAWINGS

The disclosed method and apparatus may be better understood with reference to the following drawings and description. In the figures, like reference numerals designate corresponding parts throughout the different views.

DETAILED DESCRIPTION

Figure 1:
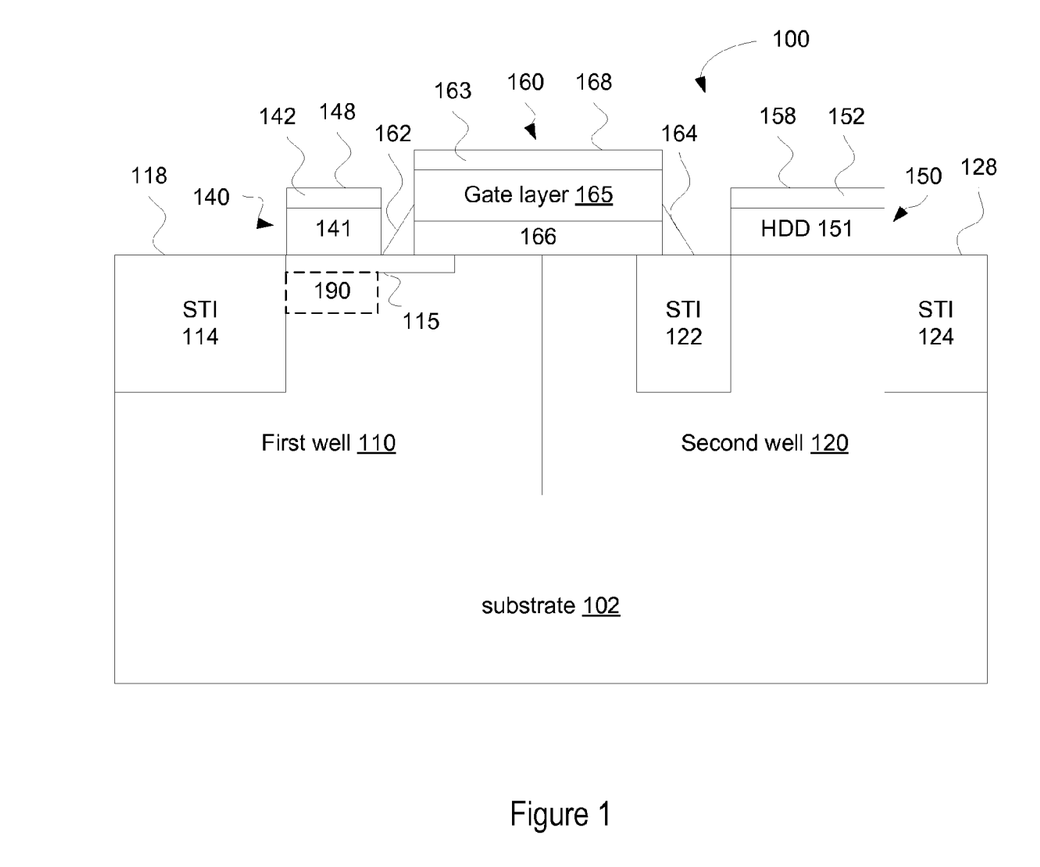
FIG. 1 shows a cross-sectional view of a semiconductor device according to a first exemplary embodiment.

FIG. 1 shows an example of a cross-sectional view of a semiconductor device 100. The semiconductor device 100 may be an n-type metal oxide semiconductor (NMOS) structure or p-type metal oxide semiconductor (PMOS). The semiconductor device 100 includes a first well 110 and a second well 120 adjacent to each other. The first well 110 is implanted in a semiconductor substrate 102. The second well 120 is also implanted in the semiconductor substrate 102. The first well 110 has a first well upper surface 118. The second well 120 has a second well upper surface 128.

The semiconductor substrate 102 may be a p-type substrate made of p-type material. The p-type material may be obtained by a doping process by adding a certain type of atoms to the semiconductor in order to increase the number of positive carriers (holes). Alternatively, the semiconductor substrate 102 may be an n-type substrate. The first well 110 may be formed by implanting a first material having a first conductivity type into the substrate 102. The second well 120 may be formed by implanting a second material having a second conductivity type into the substrate 102. The first material may be a p-type material such as boron or other suitable materials. The second material may be an n-type material such as phosphorous, arsenic, or other suitable materials.

The semiconductor device 100 includes a raised source structure 140 above and in contact with a lightly doped drain (LDD) region 115 in the first well 110. The raised source structure 140 supports a source silicide layer 142 above the surface 118 of the first well 110. The source silicide layer 142 may include a source connection point configured to connect to other electronic components. The source silicide layer 142 may have a thickness between 10 nm and 20 nm. The raised source structure 140 of an NMOS structure may include an N+ region 141 and an N-LDD region 115. The N-LDD region 115 may have a thickness in the range of between 10 nm and 100 nm. The raised source structure 140 may have a uniform thickness between 20 nm and 100 nm. Alternatively, the raised source structure 140 may not have uniform thickness and thus the source upper surface 148 may vary in height. In both cases, the source upper surface 148 is higher in at least one location than the first well upper surface 118.

LDD refers to a lightly doped drain (LDD) that has a lighter carrier concentration than a highly doped drain (HDD). The symbol "+" may designate a HDD. An LDD region may be designated by a "−" symbol following a letter "N" or "P", which indicate a n-type material or a p-type material. Thus, the N-LDD region 115 has a lighter concentration of n-type material than N+ region 141. The N+ region 141 may include an epitaxial silicon layer or extension that grows on the first well 110. The N-LDD region may have a concentration of n-type material in the ranges of $1 \times 10^{17}$ cm$^{-3}$ to $5 \times 10^{18}$ cm$^{-3}$. The first well 110 may have a concentration of p-type material in the ranges of $5 \times 10^{16}$ cm$^{-3}$ to $1 \times 10^{18}$ cm$^{-3}$.

The first well 110 includes a shallow trench isolation (STI) region 114 adjacent to the N-LDD region 115. The STI region 114 may include a dielectric material, such as SiO$_2$ or other suitable material. The STI region provides isolation and protection for the NMOS structure.

The semiconductor device 100 includes a raised drain structure 150 above and in contact with the second well 120 and separate from the gate structure 160. The raised drain structure 150 includes an N+ region 151. The N+ region 151 may include an epitaxial silicon layer or extension that grows on the second well 120. The N+ region 151 may have a uniform thickness between 60 nm and 100 nm.

The raised drain structure 150 includes a drain silicide layer 152 above the surface 128 of the second well 120. The drain silicide layer 152 may include a drain connection point configured to connect to other electronic components. The raised drain structure 150 includes a drain upper surface 158. The drain silicide layer 152 may have a thickness between 10 nm and 20 nm. The raised drain structure 150 may have a uniform thickness between 20 nm and 100 nm. In another embodiment, the raised drain structure 150 may not have uniform thickness and thus the drain upper surface 158 may not have the same height. In both cases, the drain upper surface 158 is higher in at least one location than the second well upper surface 128.

The semiconductor device 100 further includes a gate structure 160 disposed between the raised source structure 140 and the raised drain structure 150. The gate structure 160 has a gate upper surface 168. The gate structure 160 is disposed on the first well upper surface 118 and the second well upper surface 128. The gate upper surface 168 is higher than the source and drain upper surfaces 148 and 158.

The gate structure 160 includes a gate silicide layer 163, a gate layer 165, and a gate oxide layer 166. The thickness of 163 is between 10 nm and 20 nm. The thickness of 165 is between 50 nm and 150 nm. The thickness of 166 is between 2 nm and 4 nm. The gate structure 160 may be located between two spacers 162 and 164. The spacers are typically a dielectric material, such as $SiO_2$, though any suitable material can be used. The gate layer 165 is on top of the gate oxide layer 166. The gate silicide layer 163 is on top of the layer 165. Any of the above mentioned silicide layers 142, 152, and 163 may include an alloy of metal and silicon. One use of silicide layers 142, 152, and 163 is to form a low resistance interconnection between other devices with the semiconductor device 100.

The second well 120 includes STI regions 122 and 124. The STI regions 122 and 124 may be separated from each other. The raised drain structure may be located between the two STI regions 122 and 124. The spacer 162 contacts with the raised source structure 140 and the N-LDD region 115 to provide a reduction in the short channel effect. The spacer 164 may contact the STI region 122 and may be separate from the raised drain structure 150 so that the raised drain is kept away from the gate.

In an NMOS device, the raised source structure 140 and the raised drain structure 150 may include at least one of the following material: Ge, Carbon, any type of n-type material or compound such as Si—C.

In a PMOS, the raised source structure 140 and the raised drain structure 150 may include at least one of the following material: Ge, Carbon, any type of p-type material or compound such as SiGe.

Figure 2:
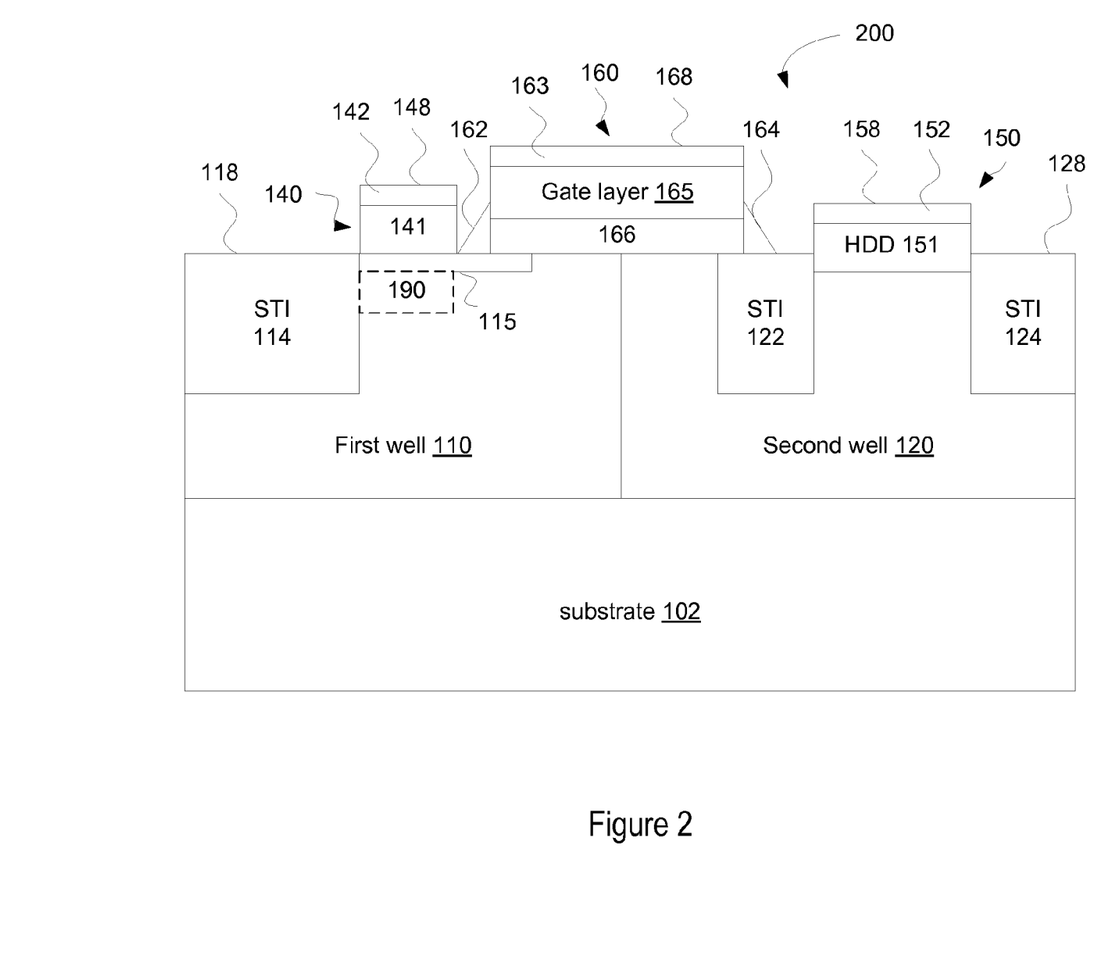
FIG. 2 shows a cross-sectional view of a semiconductor device according to a second exemplary embodiment.

FIG. 2 shows a second example of cross-sectional view of a semiconductor device 200. One of the differences between the device 100 and the device 200 is that the raised drain structure 150 in the device 200 is partially in the second well 120. The drain region can be recessed before the epitaxial layer is formed to create the raised drain, which will lower the drain resistance. The drain upper surface is higher in at least on location than the second well upper surface 128. The raised drain structure 150 may have different or same thickness as the raised source structure 140. The second well upper surface 128 may have different or same height as the first well upper surface 118.

Figure 3:
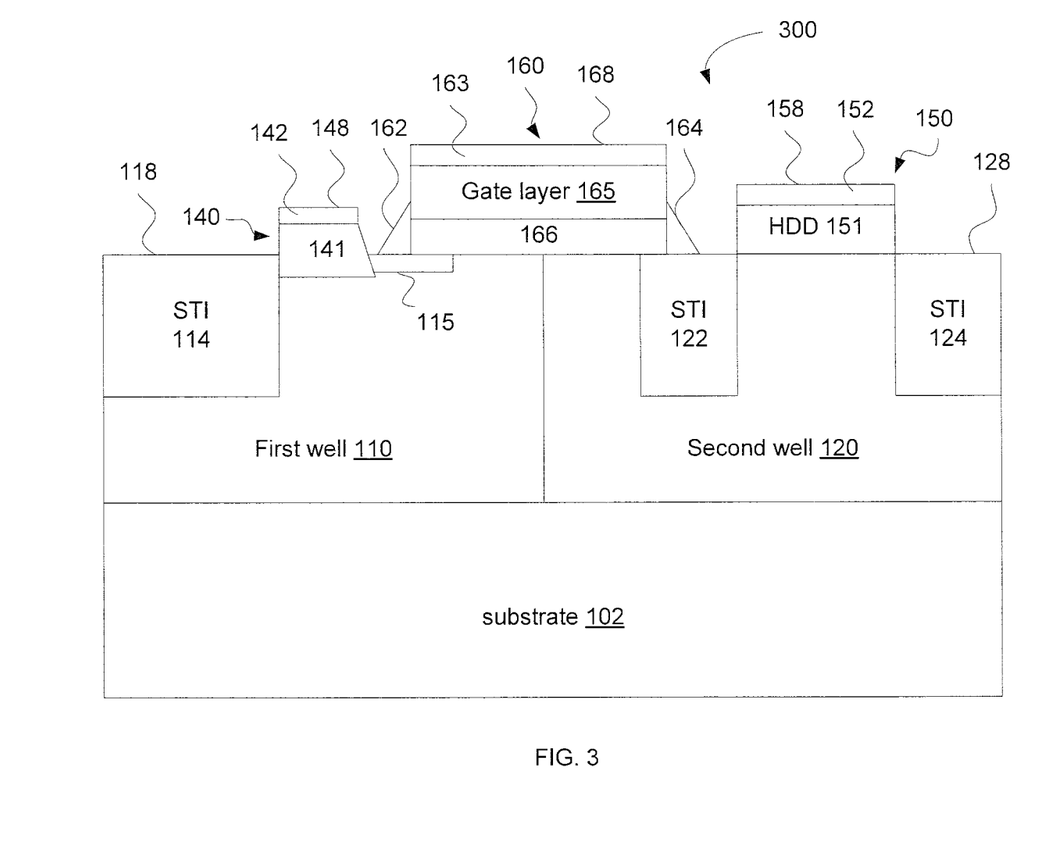
FIG. 3 shows a cross-sectional view of a semiconductor device according to a third exemplary embodiment.

FIG. 3 shows a cross-sectional view of a semiconductor device 300 according to a third exemplary embodiment. One of the differences between the device 100 and the device 300 is that the raised source structure 140 is partially in the first well 110. The source upper surface is higher in at least on location than the first well upper surface 118. This will introduce more strain to enhance the mobility and reduce the resistance. Note that even though the layout is drawn square, the real shape may have slightly different shapes from the drawn layout. Depending upon the shape, the mobility can be enhanced further. Note that both raised source structure 140 and raised drain structure 150 may have other shapes such as trapezoid, triangles, or circular shapes in the cross-section view.

In FIGS. 1-3, the structures include p-n junctions that have a potential barrier created by adjacent n-type and p-type material. Without a bias voltage on the gate structure 160, two p-n junctions exist in series between the raised source structure 140 and the raised drain structure 150. One such junction is between the raised drain structure 150 and the substrate 102, and the other junction is between the substrate 102 and the raised source structure 140. These p-n junctions prevent current conduction from the source structure 140 to the drain structure 155 upon the application of a source to drain voltage.

Further, a heterojunction 190 may be formed between the raised source structure 140 and the first well 110 as a result of the different semiconductor materials situated in the source structure 140 and the first well 110. The heterojunction 190 can form a higher barrier and increase the breakdown voltage of the semiconductor device.

Figure 4:
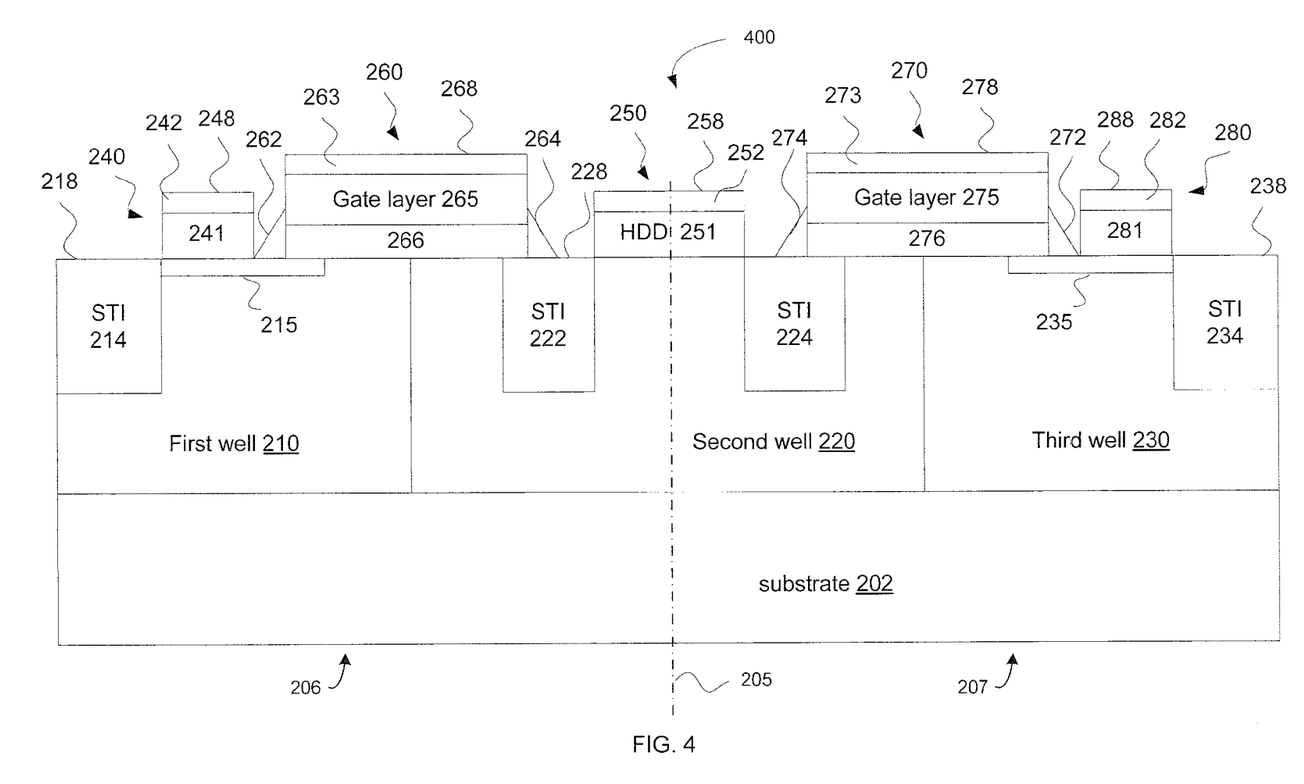
FIG. 4 shows a cross-sectional view of a semiconductor structure according to a fourth exemplary embodiment.
Figure 5:
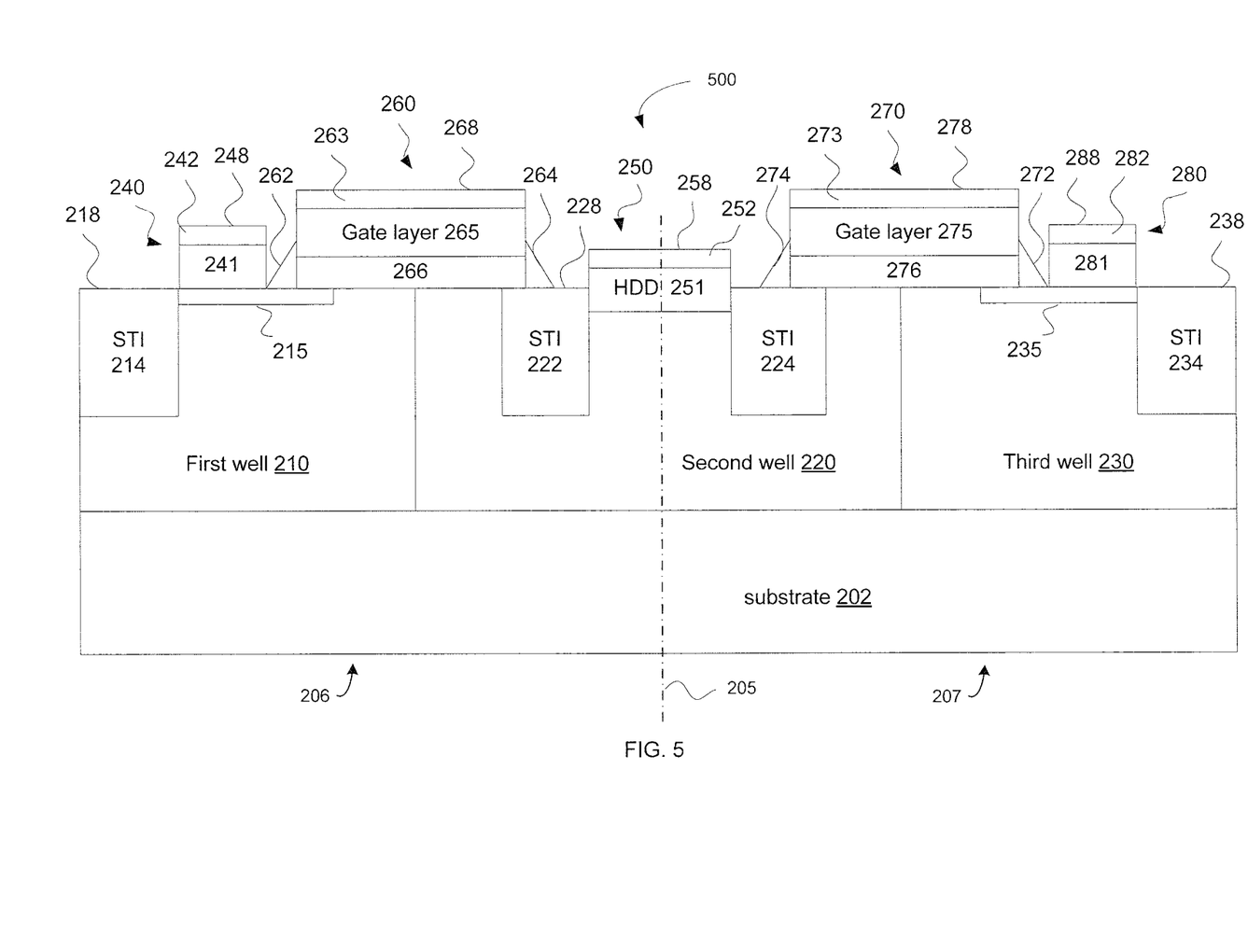
FIG. 5 shows a cross-sectional view of a semiconductor structure according to a fifth exemplary embodiment.
Figure 6:
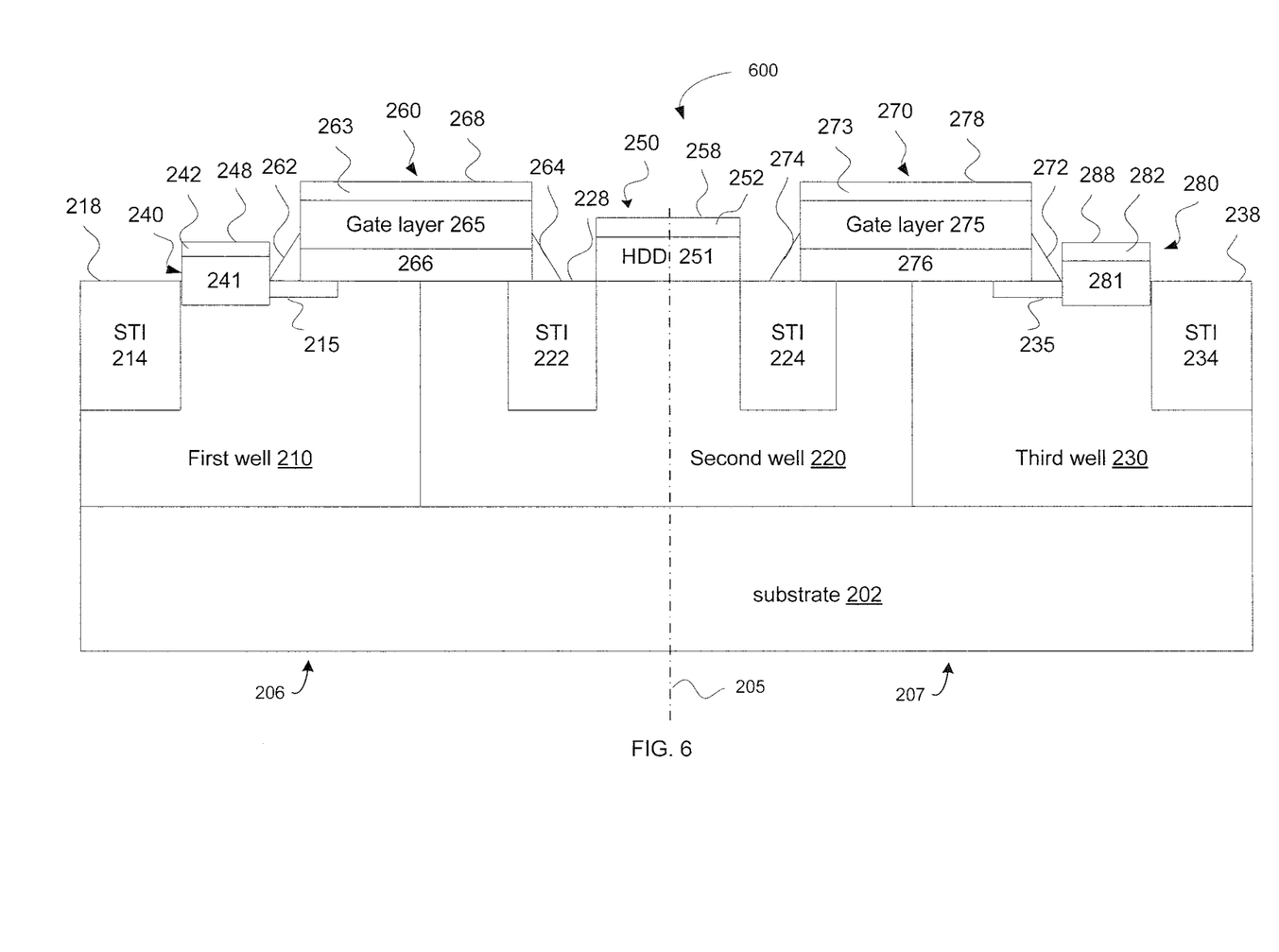
FIG. 6 shows a cross-sectional view of a semiconductor structure according to a sixth exemplary embodiment.

When fabricating the semiconductor devices, it may be more preferable to fabricate many semiconductor devices together in a single process. FIGS. 4-6 show examples of cross-sectional views of how two semiconductor structures may be fabricated side by side with the benefits of higher breakdown voltage.

FIG. 4 shows a cross-sectional view of a semiconductor structure 400 according to a fourth exemplary embodiment. The semiconductor structure 400 includes two NMOS structures 206 and 207 side by side. The NMOS structure 206 has substantially the same structure as the semiconductor device 100 in FIG. 1. The NMOS structure 207 is substantially symmetrical to the NMOS structure 206 along the line 205 in the middle of the semiconductor structure 400.

In FIG. 4, the semiconductor structure 400 includes a first well 210, a second well 220 and a third well 230 implanted on a substrate 202. The substrate may be a p-substrate implanted with a p-type material. The first and second wells 210 and 220 may be implanted with a material having different conductivity type. The first and third wells 210 and 230 may be implanted with a material having the same conductivity type. For example, the first and third wells 210 and 230 may be implanted with a p-type material while the second well 220 may be implanted with a n-type material.

The semiconductor structure 206 includes a raised source structure 240 above and in contact with a lightly doped region 215 in the first well 210. The raised source structure 240 includes a source silicide layer 242 above the surface 218 of the first well 210. The source silicide layer 242 may include a source connection point configured to connect to other electronic components. The raised source structure 240 may include an N+ region 241 and an N-LDD region 215. The N-LDD region 215 may have a thickness in the range of 20 nm and 100 nm. The raised source structure 240 may have a uniform thickness between 60 nm and 100 nm. The source upper surface 248 is higher in at least one location than the first well upper surface 218.

The raised drain structure 250 includes a drain silicide layer 252 above the surface 228 of the second well 220. The drain silicide layer 252 may include a drain connection point configured to connect to other electronic components. The raised drain structure 250 includes an N+ region 251. The raised drain structure 250 includes a drain upper surface 258. The raised drain structure 250 may have a uniform thickness between 60 nm and 100 nm. The drain upper surface 258 is higher in at least one location than the second well upper surface 228.

The semiconductor structure 207 includes a raised source structure 280 above and in contact with a lightly doped region 235 in the third well 230. The raised source structure 280 includes a source silicide layer 282 above the surface 238 of the third well 230. The source silicide layer 282 may include a source connection point configured to connect to other electronic components. The raised source structure 280 may include an N+ region 281 and the N-LDD region 235. The N-LDD region 235 may have a thickness in the range of 20 nm and 100 nm. The raised source structure 280 may have a uniform thickness between 60 nm and 100 nm. The source upper surface 288 is higher in at least one location than the third well upper surface 238.

FIG. 5 shows a cross-sectional view of a semiconductor structure 500 according to a fifth exemplary embodiment. One of the differences between the fifth exemplary embodiment 500 and the fourth exemplary embodiment 400 is that the raised drain structure 250 is partially in the second well 220. The drain upper surface is higher in at least on location than the second well upper surface 228. The raised drain structure 250 may have different or same thickness as the raised source structure 240 or 280. The second well upper surface 228 may have different or same height as the well upper surface 218 and 238.

FIG. 6 shows a cross-sectional view of a semiconductor structure 600 according to a sixth exemplary embodiment. In this embodiment, the raised source structure 240 is partially in the first well 210 and the raised source structure 280 is partially in the third well 230. The source upper surface 242 is higher in at least on location than the well upper surface 218. The source upper surface 282 is higher in at least on location than the well upper surface 238. Similar to the semiconductor structure 300 in FIG. 3, the raised source structure 240 or 280 may have a trapezoid shape or other shapes such as triangles, or circular shapes in the cross-section view.

In general, the disclosed semiconductor structure may be fabricated using a gate-first or gate-last fabrication approach. In a gate-first approach, the gate is formed early, and it then acts as a mask for the source and drain structures. After implanting the source and drain, the wafer may need to be annealed to repair the damage done during implantation. In principle, the gate-last approach uses a sacrificial gate to mask the implants, then remove it and build a new gate stack after the anneal step. In other words, the real gate is built after the source and drain structures have been formed.

Figure 7:
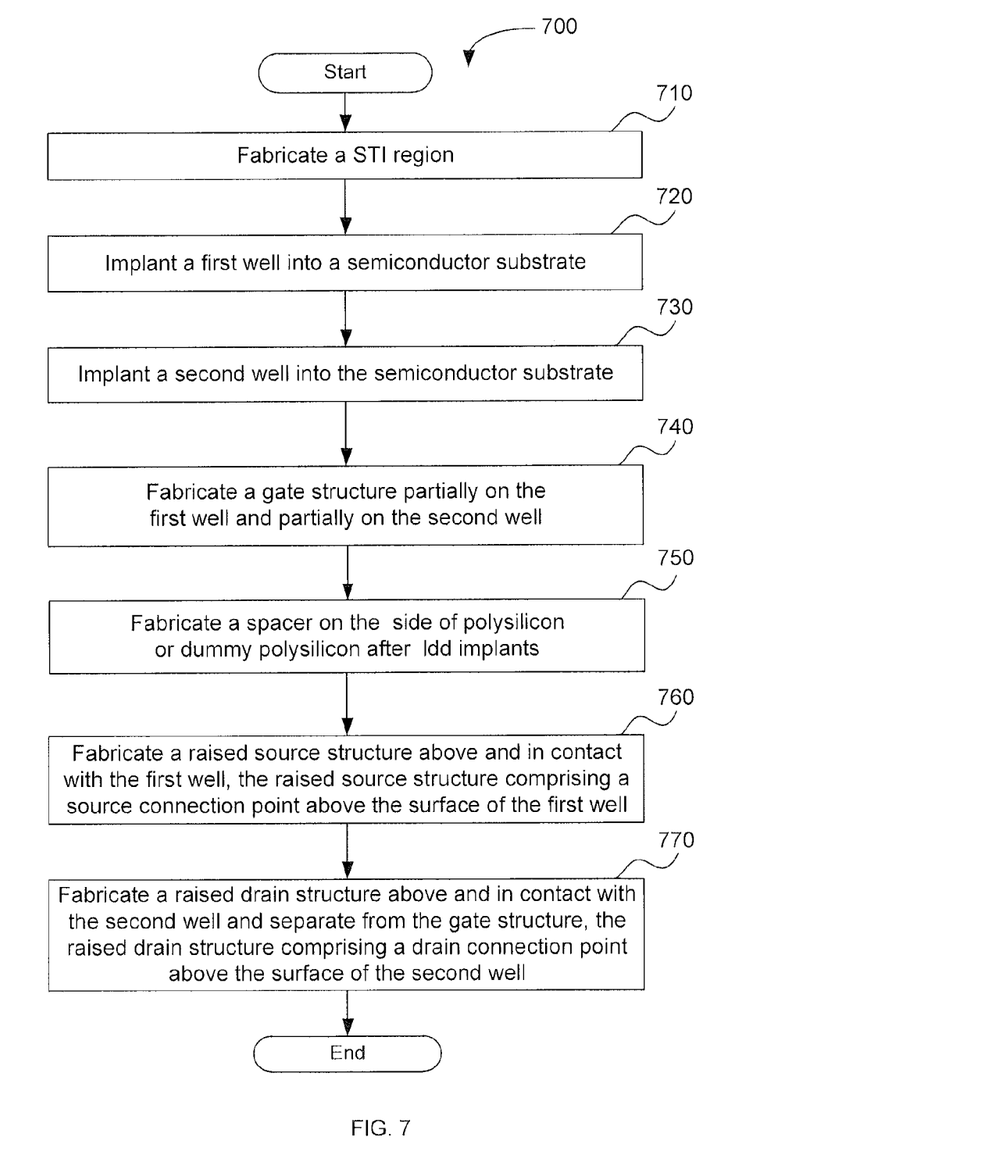
FIG. 7 shows an exemplary method to manufacture a semiconductor device.

FIG. 7 shows an exemplary fabrication process 700 for fabricating a semiconductor device with increased breakdown voltage. The method 700 is for illustration only, and the processes described below do not have to be carried out in the described order. Also, other fabrication steps may be introduced.

In the fabrication process 700, a STI region is fabricated by etching semiconductor regions in a semiconductor substrate (710). This may include depositing an etched semiconductor substrate with a dielectric material such as $SiO_2$, though any suitable material can be used, to form shallow trench isolation regions. For example, fabricating a STI region adjacent to the source in the first well and another STI region adjacent to the drain in the second well provides isolation and protection to the transistor. Forming an additional STI region in between the gate and the drain increases the breakdown voltage of the transistor. The step may include fabricating a first STI region in the first well and a second STI region in a second well.

A first well is fabricated by implanting the first well into a semiconductor substrate (720). This may include implanting a semiconductor substrate with an appropriate impurity to form a P-well or an N-well. For example, implanting the substrate with boron, a p-type material, forms the P-well, while implanting the substrate with phosphorous or arsenic, both n-type materials, forms the N-well.

A second well is fabricated by implanting a semiconductor substrate into the semiconductor substrate (730). This may include implanting a semiconductor substrate with an appropriate impurity to form a P-well or an N-well. The first well and the second wells have different conductivity types. For example, the second well may be an N-well when the first well is a P-well. The second well may be a P-well when the first well is an N-well.

A gate structure is formed by fabricating at least one semiconductor substrate partially on the first well and partially on the second well (740). This may include depositing polysilicon on top of the whole semiconductor structure and etching the polysilicon to define a gate region partially on the first well and partially on the second well. This may include implanting a semiconductor substrate with polycrystalline silicon, though any suitable material can be used, on top of a gate oxide to form the gate structure. The gate may be heavily doped to avoid the poly depletion, which may reduce the gate capacitance. The gate may be lightly doped to improve gate oxide breakdown voltage, which may reduce the drive strength. Thus, the gate needs to be doped with appropriate impurity depending on the application purpose. For example, the gate may be implanted on the order of $10^{18}$ cm$^{-3}$ to $10^{20}$ cm$^{-3}$. Lightly implanting the polycrystalline silicon with the appropriate impurity increases the gate oxide breakdown voltage of the transistor. Lightly implanting n-type material into the polycrystalline silicon to form an N-region creates the gate of an NMOS device, while lightly implanting p-type material polycrystalline silicon to form a P-region creates the gate of a PMOS device. In general, the gate is heavily implanted on the order $10^{20}$ cm$^{-3}$ to increase the transistor performance. In a gate first or gate last high K metal gate fabrication processes, the gate is formed by high K dielectric and the gate is formed by a work function metal with additional suitable layer of materials.

A spacer is fabricated by depositing a dielectric material such as $SiO_2$ on top of a semiconductor substrate to form spacers (750). This may include fabricating a spacer on a side of polysilicon or dummy polysilicon of the gate structure after implanting an LDD partially under the gate structure. The spacer is adjacent to the gate structure. For example, one spacer is adjacent to the source structure and in contact with the gate structure and separate the gate structure from the source structure. The other spacer is adjacent to drain structure and in contact with the gate structure and a STI region and separates the gate structure from the raised drain structure.

A raised source structure is fabricated by implanting a source semiconductor layer at least partially above the first well and in contact with the first well (760). This may include implanting an LDD region in the first well and fabricating a HDD region on the LDD region by growing an epitaxial silicon layer. Alternatively, this step may include implanting a HDD region after recessing a source region on the LDD region. The implanted HDD region then is partially in the first well and the formed source upper surface is above the first well surface as illustrated in FIGS. 1-6. This step may further include implanting a silicide layer on the HDD region.

A raised drain structure is fabricated by implanting a drain semiconductor region in the second well (770). This may include fabricating a HDD region above and in contact with the second well and separate from the gate structure. This step may further include implanting a silicide layer on the HDD region. The fabricated drain structure includes a drain connection point above the surface of the second well. The fabricated drain structure includes a drain connection point above the surface of the second well as illustrated in FIGS. 1-6.

The raised source structure and the raised drain structure may be fabricated together or separately. When fabricated together, one of the benefits is that the device is symmetrical. When fabricated separately, one of the benefits is that the junction leakage can be reduced for a non-raised drain structure since the hetero junction tends to introduce a higher leakage.

The method may further includes forming a silicide layer that includes depositing metal on top of poly silicon and then alloy to create silicide, though any suitable material can be used, on top of the gate, the source, and the drain of a transistor to form the connection between the fabricated transistor and a metallization layer. The metallization layer forms the interconnections between the fabricated transistor and other devices. The region of the semiconductor substrate in between the gate and the drain may lack silicide. In other words, there is a gap in the silicide layer between the gate and the drain, requiring the removal of any silicide in this region.

The embodiments disclose are for illustrative purposes only, and are not limiting. Many other embodiments and implementations are possible within the scope of the systems and methods. Accordingly, the devices and methods are not to be restricted except in light of the attached claims and their equivalents.

What is claimed is:

1. A semiconductor device, comprising:
   a first well disposed in a semiconductor substrate;
   a second well disposed in the semiconductor substrate;
   a gate structure disposed over both the first and second wells; and
   a raised drain structure comprising a highly doped drain (HDD) above and in contact with the second well and separate from the gate structure, the raised drain structure further comprising a drain silicide layer directly disposed on the HDD,
   wherein the second well comprises a first shallow trench isolation (STI) region and a second STI region disposed on either side of the raised drain structure, the first STI region contacting the gate structure; and
   wherein the HDD is at least partially above an upper surface of the second well so that the drain silicide layer is above and separate from the second STI region.

2. The semiconductor device of claim 1, further comprising:
   a raised source structure above and in contact with the first well, the raised source structure comprising a source connection point above the surface of the first well; and
   a heterojunction between the raised source structure and the first well configured to form a barrier that increases a breakdown voltage of the semiconductor device, as compared to the breakdown voltage without the barrier.

3. The semiconductor device of claim 2, wherein the first well comprises a lightly doped region disposed at least partially under the raised source structure and under the gate structure.

4. The semiconductor device of claim 3,
   wherein the first well is implanted with a material having a first conductivity type; and
   wherein the second well is implanted with a material having a second conductivity type.

5. The semiconductor device of claim 4, wherein the first conductivity type is p-type and the second conductivity type is n-type.

6. The semiconductor device of claim 4, wherein the raised source structure comprises a highly doped source region with respect to and on top of the lightly doped region.

7. The semiconductor device of claim 6, wherein the HDD is more highly doped than the lightly doped region.

8. The semiconductor device of claim 7, wherein the highly doped source region, the HDD, or both have a thickness between 60 nm and 100 nm.

9. A semiconductor device, comprising:
   a first well having a first well upper surface;
   a second well having a second well upper surface;
   a gate structure disposed over both the first well upper surface and the second well upper surface;
   a raised source structure disposed above and in contact with the first well having a source upper surface higher in at least one location than the first well upper surface; and
   a heterojunction between the raised source structure and the first well configured to form a barrier that increases a breakdown voltage of the semiconductor device, as compared to the breakdown voltage without the barrier,
   wherein the first well comprises a lightly doped region that contacts the raised source structure and the gate structure.

10. The semiconductor device of claim 9, further comprising a raised drain structure disposed above and in contact with the second well and having a drain upper surface higher in at least one location than the second well upper surface.

11. The semiconductor device of claim 10, wherein the gate structure has a gate upper surface higher than the source and drain upper surfaces.

12. The semiconductor device of claim 11, wherein the second well comprises a first shallow trench isolation (STI) region and a second STI region spaced apart; and wherein the raised drain structure further comprises a highly doped drain (HDD) and a drain silicide layer directly disposed on the HDD, the HDD is at least partially above an upper surface of the second well so that the drain silicide layer is separate from the gate structure and the second STI region.

13. The semiconductor device of claim 12, wherein raised drain is located between the first and second STI regions.

14. The semiconductor device of claim 13, wherein the lightly doped region comprises a doped upper surface lower than the source upper surface.

15. The semiconductor device of claim 14, wherein the raised source structure and the raised drain structure each comprises an epitaxial layer having a thickness between 60 nm and 100 nm.

16. The semiconductor device of claim 15, wherein the raised source structure and the raised drain structure each comprises a silicide layer disposed on the epitaxial layer.

17. A semiconductor device, comprising:
   a first well comprising a first well upper surface;
   a second well comprising a second well upper surface;
   a gate structure disposed over both the first well upper surface and the second well upper surface, the gate structure comprising a gate upper surface; and
   a raised source structure disposed above and in contact with the first well, the raised source structure comprising a source upper surface positioned at least partially between the first well upper surface and the gate upper surface,
   wherein the first well comprises a lightly doped region disposed partially under and in contact with both the raised source structure and the gate structures and;
   wherein the raised source structure further comprises a highly doped source region directly disposed on the lightly doped region.

18. The semiconductor device of claim 17, further comprising a raised drain structure disposed above and in contact with the second well and comprising a drain upper surface positioned at least partially between the second well upper surface and the gate upper surface.

19. The semiconductor device of claim 18, wherein the second well comprises a first shallow trench isolation (STI) region and a second STI region spaced apart from the first STI region; and wherein the raised source structure further comprises a source silicide layer directly disposed on the highly doped source region, the source silicide layer is separate from the gate structure and the lightly doped region.

20. The semiconductor device of claim 19, wherein the raised drain is located at least partially between the first and second STI regions.

* * * * *